United States Patent
Otsuka

(10) Patent No.: US 11,778,749 B2
(45) Date of Patent: Oct. 3, 2023

(54) MOUNTING STRUCTURE AND MANUFACTURING METHOD OF MOUNTING STRUCTURE

(71) Applicant: NEC Corporation, Tokyo (JP)

(72) Inventor: Kyoko Otsuka, Tokyo (JP)

(73) Assignee: NEC CORPORATION, Tokyo (JP)

( * ) Notice: Subject to any disclaimer, the term of this patent is extended or adjusted under 35 U.S.C. 154(b) by 221 days.

(21) Appl. No.: 17/466,436

(22) Filed: Sep. 3, 2021

(65) Prior Publication Data

US 2022/0095460 A1 Mar. 24, 2022

(30) Foreign Application Priority Data

Sep. 24, 2020 (JP) ................. 2020-159316

(51) Int. Cl.
| | |
|---|---|
| H05K 1/18 | (2006.01) |
| G06F 1/16 | (2006.01) |
| H05K 3/36 | (2006.01) |
| H05K 1/02 | (2006.01) |

(52) U.S. Cl.
CPC ............ *H05K 1/189* (2013.01); *G06F 1/163* (2013.01); *H05K 1/0281* (2013.01); *H05K 3/361* (2013.01)

(58) Field of Classification Search
CPC ...... H05K 1/189; H05K 1/163; H05K 1/0281; H05K 3/361

USPC ......................................... 361/780
See application file for complete search history.

(56) References Cited

U.S. PATENT DOCUMENTS

| | | | |
|---|---|---|---|
| 9,036,359 B2 * | 5/2015 | Nishimura | H05K 3/32 |
| 2015/0311423 A1 * | 10/2015 | Murakami | H04R 17/00 |
| | | | 310/366 |
| 2018/0279467 A1 * | 9/2018 | Kamakura | H05K 1/0281 |

FOREIGN PATENT DOCUMENTS

| | | |
|---|---|---|
| JP | 2008-258497 A | 10/2008 |
| JP | 2019-197313 A | 11/2019 |

* cited by examiner

*Primary Examiner* — Binh B Tran
(74) *Attorney, Agent, or Firm* — Sughrue Mion, PLLC

(57) ABSTRACT

To provide a mounting structure in which a connection unit is protected and a non-flexible region is small, the mounting structure includes a flexible wiring board, a non-flexible component, and a connection unit provided in a region smaller than a bottom face of the non-flexible component and connecting the flexible wiring board and the non-flexible component. The mounting structure includes a protection resin sealing the connection unit in such a way that the flexible wiring board and the non-flexible component are separable. The protection resin covers only a region where the connection unit is provided. To a face of the flexible wiring board, being on an opposite side to the connection unit, a reinforcing material is added. The reinforcing material covers a region where the connection unit is provided and being narrower than the bottom face of the non-flexible component.

14 Claims, 13 Drawing Sheets

MOUNTING STRUCTURE AND MANUFACTURING METHOD OF MOUNTING STRUCTURE

This application is based upon and claims the benefit of priority from Japanese Patent Application No. 2020-159316, filed on Sep. 24, 2020, the disclosure of which is incorporated herein in its entirety by reference.

TECHNICAL FIELD

The present invention relates to a mounting structure and a manufacturing method of a mounting structure.

BACKGROUND ART

In recent years, as in a wearable device to be worn and used by a person, and the like, an electronic device has been actively mounted on a curved face. For a device mounted on a curved face in this manner, it is necessary to mount an electronic component and a module on a flexible substrate such as a flexible printed wiring board. In contrast, an electronic component such as a semiconductor chip, an electronic module using a glass epoxy substrate, and the like are non-flexible. A connection unit between such a non-flexible electronic component or module and a flexible substrate is non-flexible and therefore is broken when being deformed. Therefore, a technique of protecting a connection unit while flexibility of an outside of the connection unit is maintained has been developed.

Japanese Unexamined Patent Application Publication No. 2019-197313, for example, discloses a method of providing, in a flexible substrate, a frame-shaped reinforcing unit that surrounds a region where an electronic component is mounted. Japanese Unexamined Patent Application Publication No. 2008-258497 discloses a technique of causing a reinforcing plate that covers a region wider than a region where a component is disposed, to adhere to a reverse face of a component mounting unit.

SUMMARY

However, in the technique in Japanese Unexamined Patent Application Publication No. 2019-197313, a problem that a non-flexible region becomes large is produced. According to the technique, a frame-shaped reinforcing unit that surrounds a region wider than a component is provided and therefore, flexibility of that portion is lost. However, for example, in a wearable device, when a non-flexible region is large, a wearer may feel a sense of discomfort. Therefore, a non-flexible region is desirably small. In Japanese Unexamined Patent Application Publication No. 2008-258497, a reinforcing plate wider than a region where a component is disposed is used and therefore, flexibility of that portion is lost. Therefore, similarly to Japanese Unexamined Patent Application Publication No. 2019-197313, a problem that a non-flexible region becomes large is produced.

In view of the problem described above, the present invention has been made, and an object of the present invention is to provide a mounting structure in which a connection unit is protected and a non-flexible region is small.

In order to solve the above-described problem, a mounting structure according to the present invention includes a flexible wiring board, a non-flexible component, and a connection unit that is provided in a region smaller than a bottom face of the non-flexible component and connects the flexible wiring board and the non-flexible component. Further, the mounting structure includes, other than the connection unit, a protection resin that seals the connection unit in such a way that the flexible wiring board and the non-flexible component are separable from each other. The protection resin covers only a region where the connection unit is provided. To a face of the flexible wiring board, which is on an opposite side to the connection unit, a reinforcing material is added. The reinforcing material covers a region that includes a region where the connection unit is provided and is narrower than the bottom face of the non-flexible component.

A manufacturing method of a mounting structure according to the present invention includes forming, by using a flexible wiring board and a non-flexible component, a connection unit that connects the flexible wiring board and the non-flexible component in a region of a bottom face of the non-flexible component, the region being narrower than the bottom face. The manufacturing method further includes sealing, on an outside of the connection unit, the connection unit with a protection resin in such a way that the flexible wiring board and the non-flexible component are separable from each other. In addition, the manufacturing method further includes adding, to a face of the flexible wiring board, which is on an opposite side to the connection unit, a reinforcing material that covers a region that is larger than a region where the connection unit is provided and is narrower than the bottom face of the non-flexible component.

An advantageous effect of the present invention is to be able to provide a mounting structure in which a connection unit is protected and a non-flexible region is small.

BRIEF DESCRIPTION OF THE DRAWINGS

Exemplary features and advantages of the present invention will become apparent from the following detailed description when taken with the accompanying drawings in which.

EXAMPLE EMBODIMENT

Hereinafter, with reference to the accompanying drawings, example embodiments according to the present invention are described in detail. However, according to the following example embodiments, while technically desirable limitations are made in order to carry out the present invention, the scope of the invention is not limited to the following. Similar components in drawings are assigned with the same number, and description therefor may be omitted.

First Example Embodiment

Figure 1:
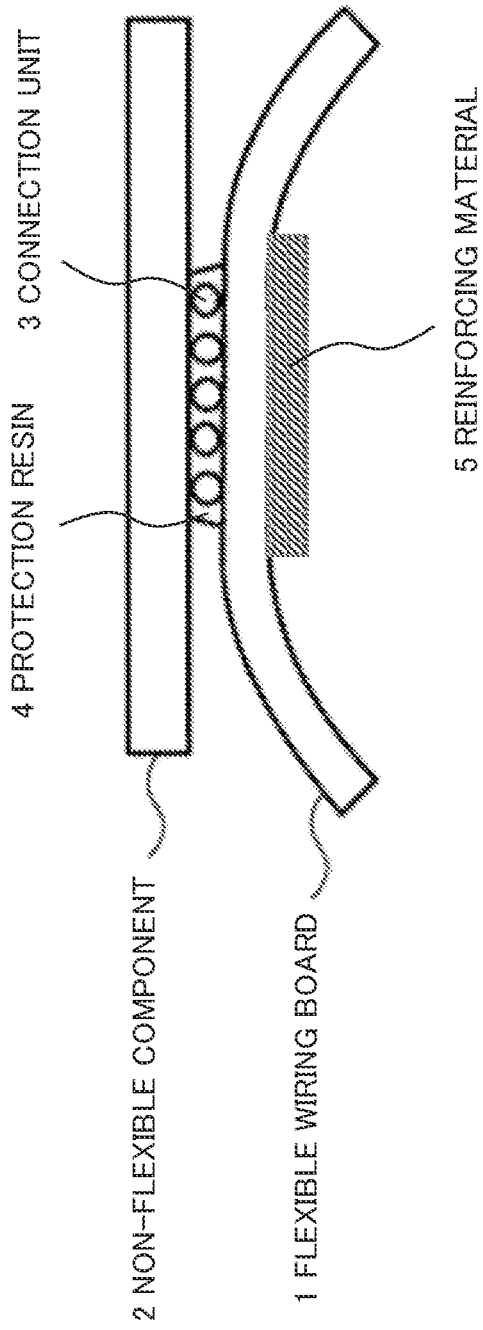
FIG. 1 is a schematic cross-sectional diagram illustrating a mounting structure according to a first example embodiment.

FIG. 1 is a cross-sectional diagram illustrating a mounting structure 10 according to the present example embodiment. The mounting structure 10 includes a flexible wiring board 1, a non-flexible component 2, and a connection unit 3 that is provided in a region smaller than a bottom face of the non-flexible component 2 and connects the flexible wiring board 1 and the non-flexible component 2. Further, the mounting structure 10 includes, other than the connection unit 3, a protection resin 4 that seals the connection unit 3 in such a way that the flexible wiring board 1 and the non-flexible component 2 are separable from each other. The protection resin 4 covers only a region where the connection unit 3 is provided. A reinforcing material 5 is added to a face of the flexible wiring board 1, the face which is on an opposite side to the connection unit 3. The reinforcing material 5 covers a region that includes an entire region where the connection unit 3 is provided and is narrower than a bottom face on an inside of the bottom face of the non-flexible component 2.

When the above-described configuration is employed, the connection unit 3 is protected by the reinforcing material 5. In addition, a region where flexibility is lost can be limited to an inside of the non-flexible component 2 by the reinforcing material 5. Therefore, compared with the methods according to Japanese Unexamined Patent Application Publication No. 2019-197313 and Japanese Unexamined Patent Application Publication No. 2008-258497, a region where flexibility of the flexible wiring board 1 is lost can be decreased.

Second Example Embodiment

Figure 2:
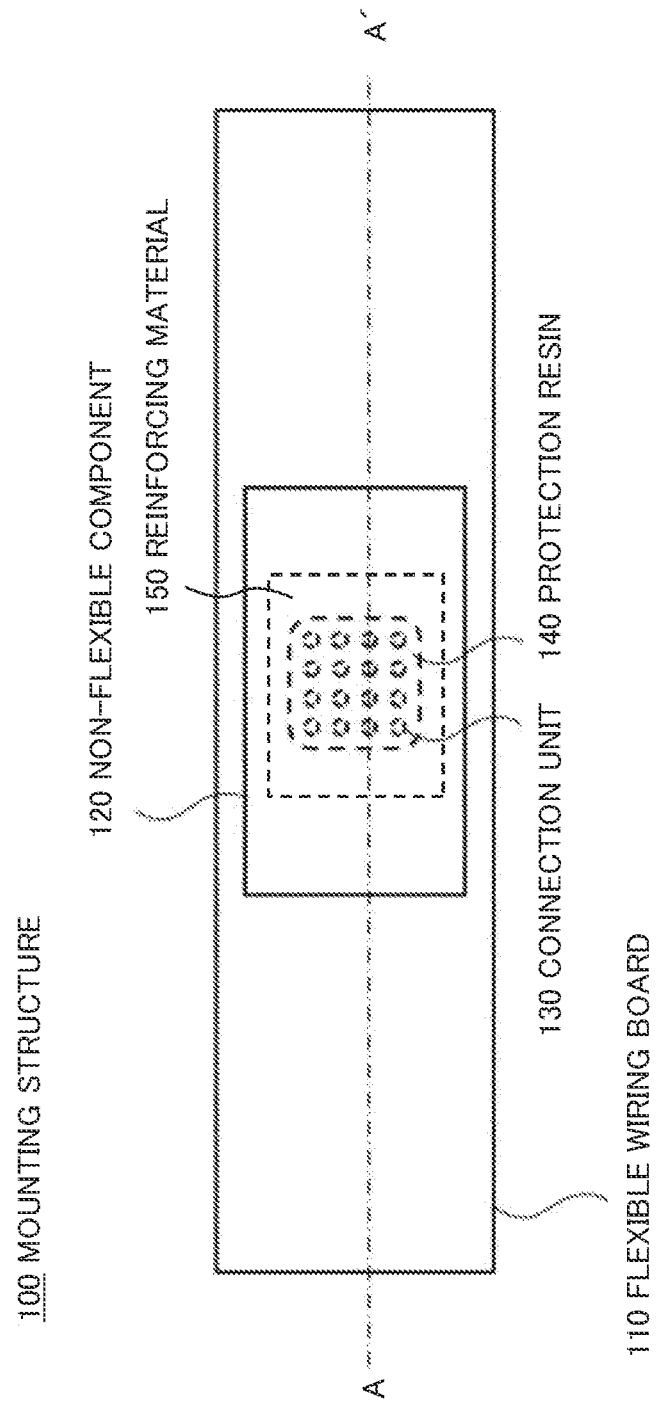
FIG. 2 is a plan view illustrating a mounting structure according to a second example embodiment.

According to the present example embodiment, a specific configuration of a mounting structure employing the first example embodiment as a basis configuration is described. FIG. 2 is a plan view illustrating a mounting structure 100 according to the present example embodiment. The mounting structure 100 includes a flexible wiring board 110 and a non-flexible component 120. On a bottom face of the non-flexible component 120 (a face opposite to the flexible wiring board 110), a connection unit 130 that connects the flexible wiring board 110 and the non-flexible component 120 is provided in a region narrower than the bottom face.

A protection resin 140 is provided in such a way as to cover only a region where the connection unit 130 exists. A reinforcing material 150 is added to a face of the flexible wiring board 110, the face which is on an opposite side to the connection unit 130. The reinforcing material 150 covers a region that includes a region where the connection unit 130 is provided and is narrower than the bottom face of the non-flexible component 120. Note that "addition" according to the present example embodiment indicates that a member is caused to adhere or a material having adhesiveness is added. An example of addition includes, for example, a matter that a sheet-shaped or plate-shaped member is caused to adhere by using an adhesive material or an adhesive tape and a matter that a resin having fluidity is supplied and then hardened.

Figure 3:
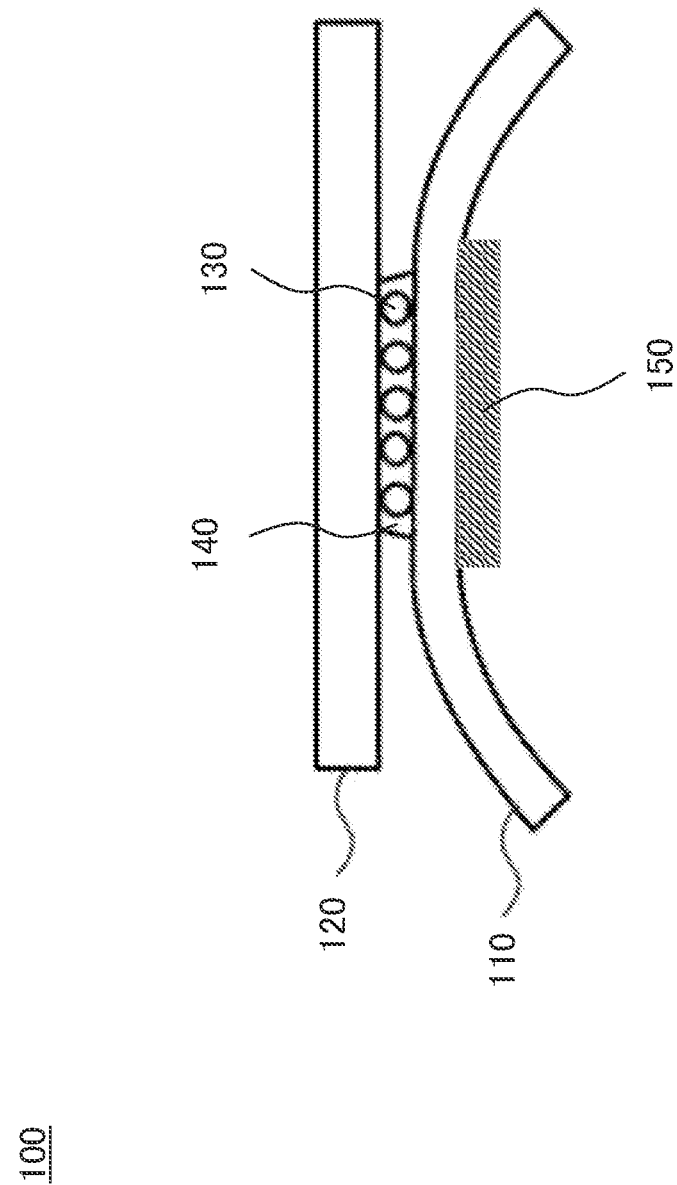
FIG. 3 is a cross-sectional diagram illustrating the mounting structure according to the second example embodiment.

FIG. 3 is a cross-sectional diagram in a line of A-A' of FIG. 2. The flexible wiring board 110 and the non-flexible component 120 are connected by the connection unit 130, and the connection unit 130 is covered with the protection resin 140. A region where the connection unit 130 and the protection resin 140 exist is narrower than a bottom face of the non-flexible component 120. The reinforcing material 150 is added to a face (hereinafter, also referred to as a reverse face) of the flexible wiring board 110, the face which is on an opposite side to the connection unit 130. As illustrated in FIG. 3, the reinforcing material 150 covers a region that includes the connection unit 130 and is narrower than the bottom face of the non-flexible component 120. According to the example in FIG. 3, the reinforcing material 150 covers up to a portion close to an outer edge of the connection unit 130, and outside the portion, the flexible wiring board 110 can be bent in a direction of separating from the non-flexible component 120.

When the above-described configuration is employed, a range where flexibility of the flexible wiring board 110 is lost can be limited to a range smaller than a bottom face of the non-flexible component 120. However, deformation of the connection unit 130 is suppressed by the reinforcing material 150, and thereby the connection unit 130 can be protected. In other words, while it is a structure following a curved face more easily than the structures according to Japanese Unexamined Patent Application Publication No. 2019-197313 and Japanese Unexamined Patent Application Publication No. 2008-258497, strength of a connection unit can be increased. In the following, specific examples of a force applied to the flexible wiring board 110 and advantageous effects are described.

Figure 4:
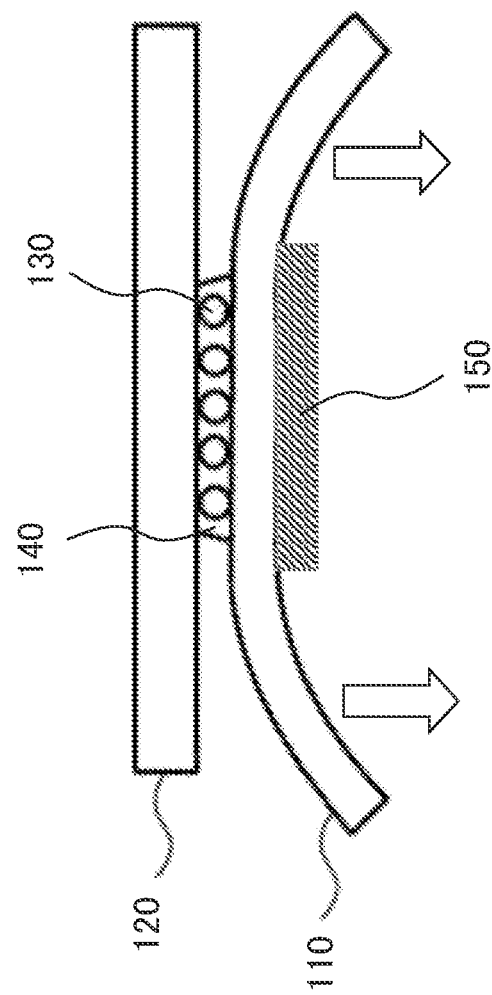
FIG. 4 is a schematic cross-sectional diagram illustrating a first example of an action of the mounting structure according to the second example embodiment.

FIG. 4 is a schematic diagram illustrating an example in which a force of a direction of separating, from a non-flexible component 120, an outside of a flexible wiring board 110 being on a lower side of the figure is applied. A direction of the force is indicated by a block arrow. In this case, the flexible wiring board 110 is deformed up to a vicinity of a connection unit 130. At that time, when a reinforcing material 150 does not exist, a crack is likely to occur between the flexible wiring board 110, and the connection unit 130 and a protection resin 140. However, according to the present example embodiment, the reinforcing material 150 exists, and therefore, deformation of the flexible wiring board 110 is unlikely to spread to the connection unit 130, whereby a crack and a fracture are unlikely to occur in the connection unit 130 and the protection resin 140.

Figure 5:
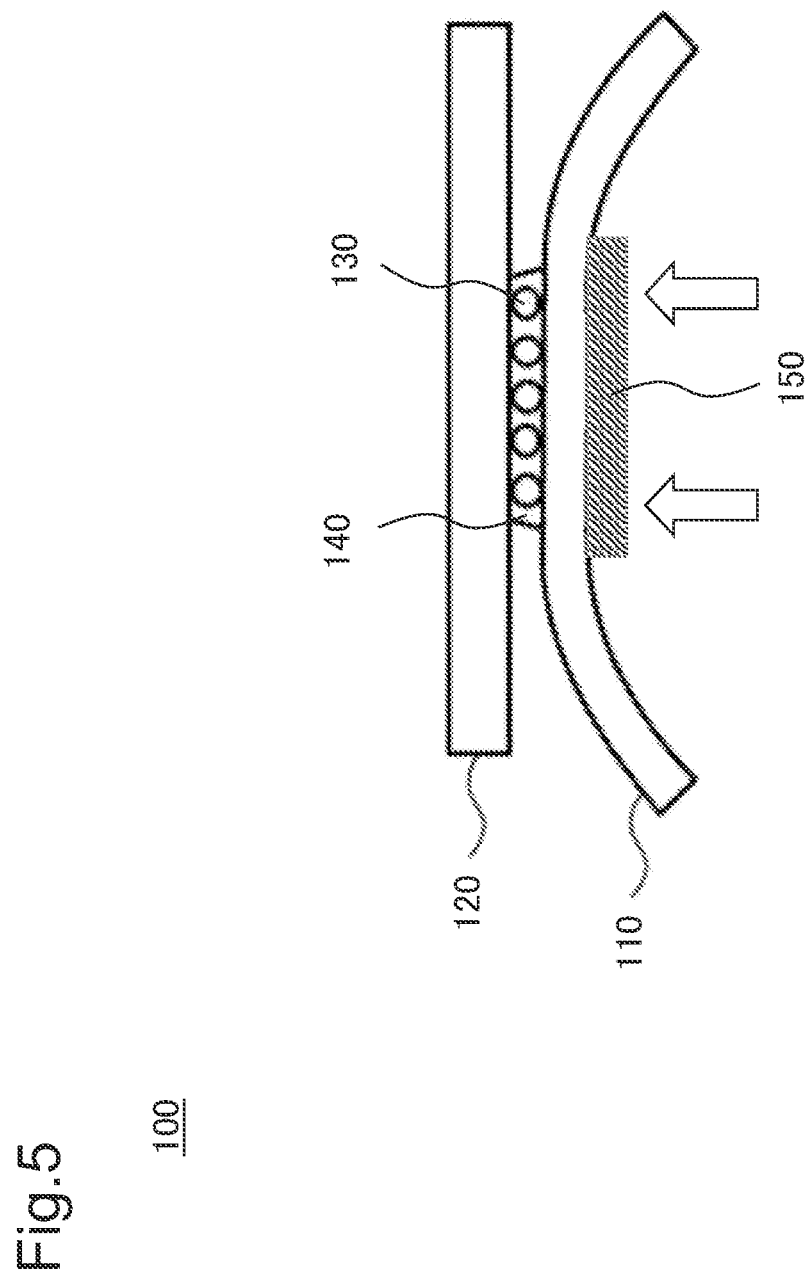
FIG. 5 is a schematic cross-sectional diagram illustrating a second example of an action of the mounting structure according to the second example embodiment.

FIG. 5 is a schematic diagram illustrating an example in which a force of a compression direction from an outside of a reinforcing material 150 being on a lower side of the figure is applied. A direction of the force is indicated by a block arrow. In this case, the force is dispersed by the reinforcing material 150, and thereby the force can be avoided from concentrating in a part of a connection unit 130.

Figure 6:
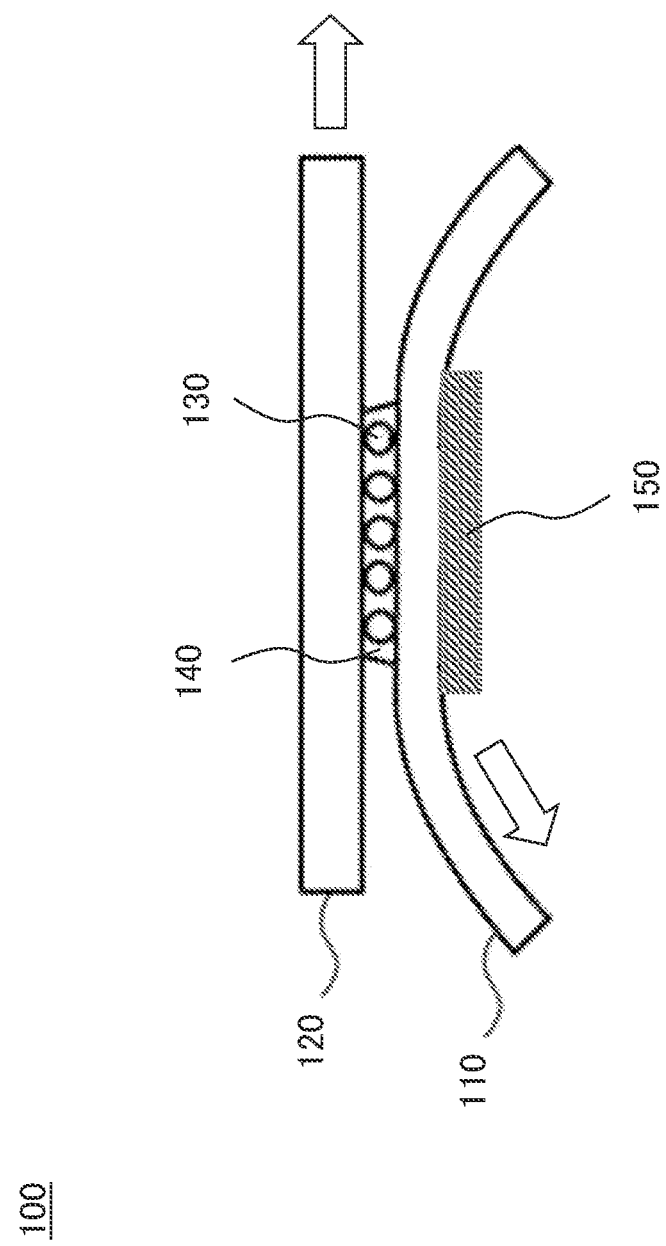
FIG. 6 is a schematic cross-sectional diagram illustrating a third example of an action of the mounting structure according to the second example embodiment.

FIG. 6 is a schematic diagram illustrating an example in which a force of a direction where a flexible wiring board 110 and a non-flexible component 120 are misaligned is applied. A direction of the force is indicated by a block arrow. In this case, deformation of the flexible wiring board 110 is suppressed by a reinforcing material 150, and thereby a connection unit 130 can be protected.

Herein, specific examples of elements are described. The flexible wiring board 110 is produced, for example, by forming wiring such as copper on a substrate such as polyimide and polyethylene terephthalate (PET). The non-flexible component 120 is, for example, a semiconductor chip, a glass epoxy substrate, a ceramic substrate, and a module in which on each of these substrates, an electronic component is mounted. The connection unit 130 can be formed, for example, by using nickel, gold, alloy thereof, solder, or the like. For the protection resin 140, for example, an epoxy resin, a polyimide resin, a silicon-based resin, and the like are usable. To these resins, a filler may be added.

For the reinforcing material 150, a material having an elastic modulus higher than the flexible wiring board 110 is desirable. As a specific material, for example, a PET plate, a glass epoxy plate, metal, glass, and the like are usable. When processes such as reflow and thermal hardening are passed after the reinforcing material 150 is added to the flexible wiring board 110, a material endurable to temperatures of the processes is selected as the reinforcing material 150. As a shape of the reinforcing material 150, for example, a plate shape, a film shape, and a tape shape including an adhesive layer for adhesion to the flexible wiring board 110 are employable. A resin that increases rigidity after being hardened may be formed via coating and hardening. A thickness of the reinforcing material 150 may be selected, as appropriate, in such a way as to acquire a desired rigidity.

Figure 7:
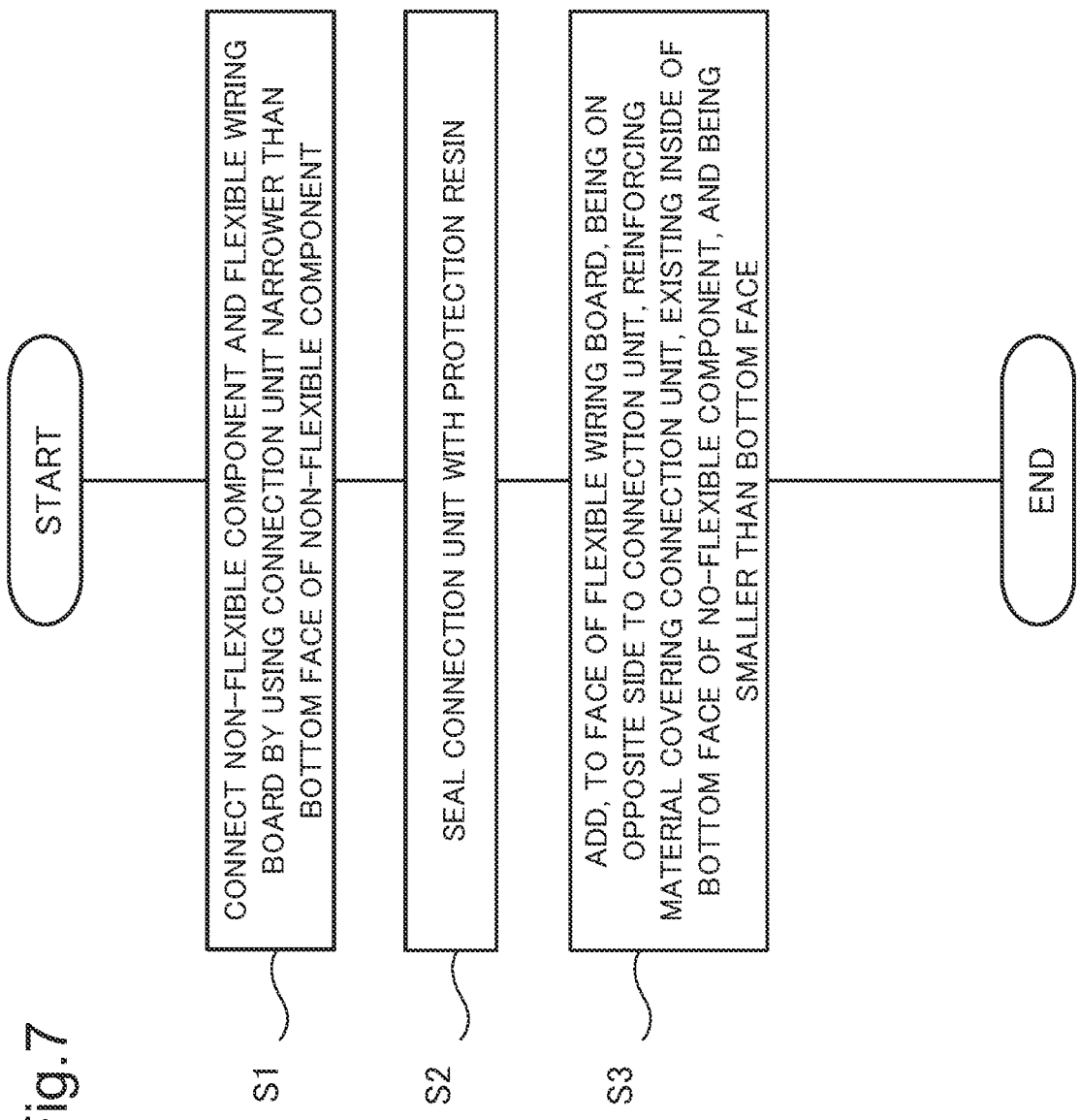
FIG. 7 is a flowchart illustrating a manufacturing method of the mounting structure according to the second example embodiment.

FIG. 7 is a flowchart illustrating a manufacturing method of the mounting structure 100. First, by using solder bump connection or the like, a connection unit 130 having a region narrower than a bottom face of a non-flexible component 120 is formed, and a flexible wiring board 110 and the non-flexible component 120 are connected (S1). Next, a protection resin 140 that seals the connection unit 130 is formed (S2). Next, on a face of the flexible wiring board 110, the face which is on an opposite side to the connection unit 130, a reinforcing material is added to a region that includes the connection unit 130 and is smaller than the bottom face of the non-flexible component 120 (S3).

As described above, according to the mounting structure in the present example embodiment, while a region where flexibility is lost is decreased and a portion where the flexible wiring board 110 follows a curved face is increased, a connection unit can be protected by a reinforcing material.

Third Example Embodiment

Figure 8:
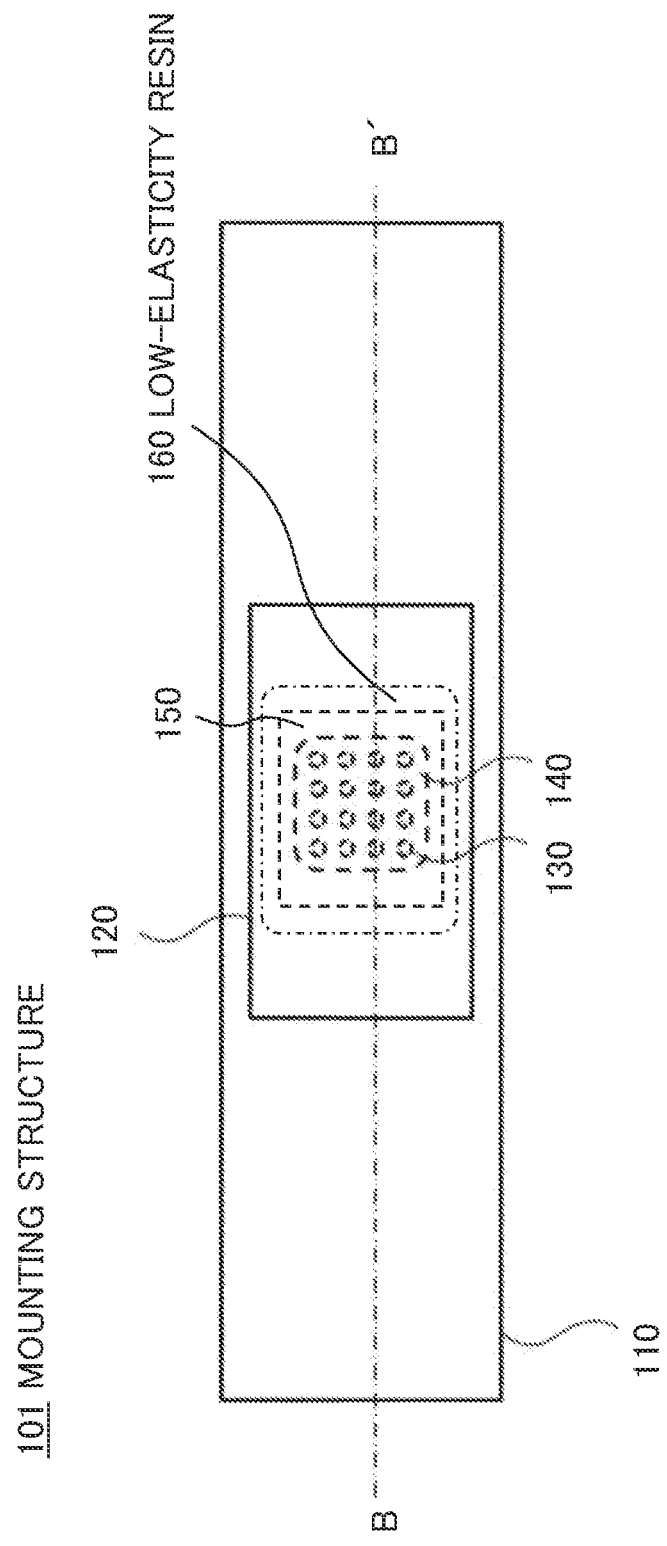
FIG. 8 is a plan view illustrating a mounting structure according to a third example embodiment.
Figure 9:
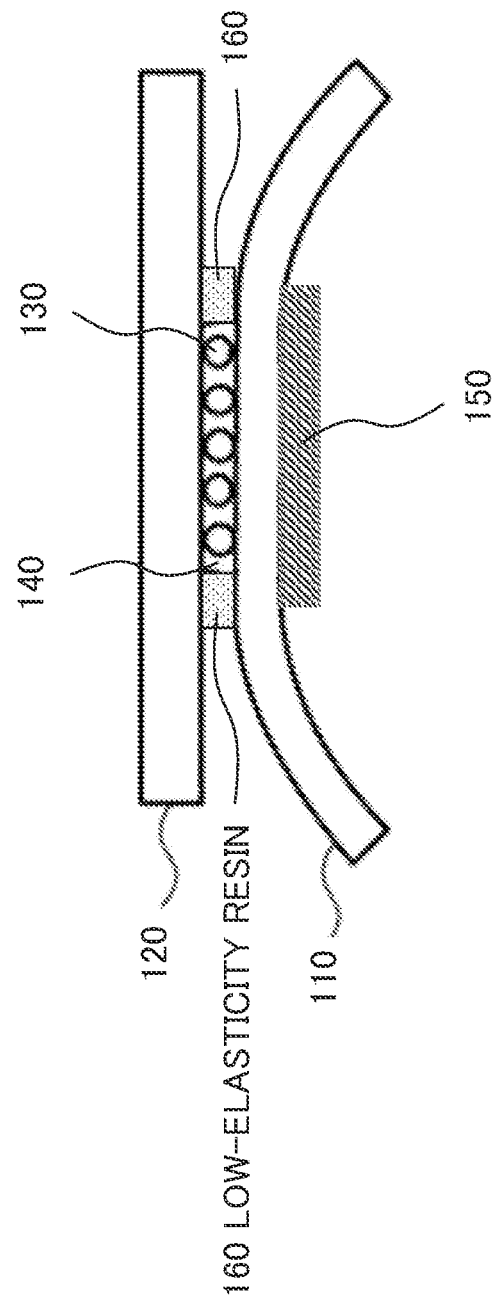
FIG. 9 is a schematic cross-sectional diagram illustrating the mounting structure according to the third example embodiment.

According to the present example embodiment, a configuration in which stress concentration in an end of a reinforcing material 150 is relaxed is described. When stress is concentrated in an end of the reinforcing material 150, a flexible wiring board 110 is bent, and as a result, a substrate may be broken and wiring may be disconnected. FIG. 8 is a plan view illustrating a mounting structure 101 according to the present example embodiment, and FIG. 9 is a cross-sectional diagram in a line of B-B' of FIG. 8.

The mounting structure 101 includes, in addition to the mounting structure 100 according to the second example embodiment, a low-elasticity resin 160 in a periphery of a protection resin 140. The low-elasticity resin 160 is provided in such a way as to overlap an end of the reinforcing material 150. Low elasticity referred to herein indicates that the elasticity is lower than the protection resin 140. When, for example, a force of pulling down an end of the flexible wiring board 110 in FIG. 9 works, stress is concentrated, when there is no low-elasticity resin 160, in an end of the reinforcing material 150, and then a force of bending the flexible wiring board 110 is generated. In contrast, when the low-elasticity resin 160 is provided in such a way as to straddle an end of the reinforcing material 150, the low-elasticity resin 160 protruding from an outside of the reinforcing material 150 generates a force of a direction of suppressing bending of the flexible wiring board 110. Thereby, bending of the flexible wiring board 110 in an end of the reinforcing material 150 is unlikely to occur. In FIG. 9, when an impact of a direction of compressing a back face of the reinforcing material 150 toward the non-flexible component 120 is applied, an end of the reinforcing material 150 can disperse and receive a force of pressing and crushing the connection unit 130 by using the low-elasticity resin 160.

As described above, when the low-elasticity resin 160 is provided, stress in a vicinity of an end of the reinforcing material 150 is dispersed and local concentration of stress is suppressed, and thereby breakage of the flexible wiring board 110 and the connection unit 130 can be easily prevented.

Fourth Example Embodiment

Figure 10:
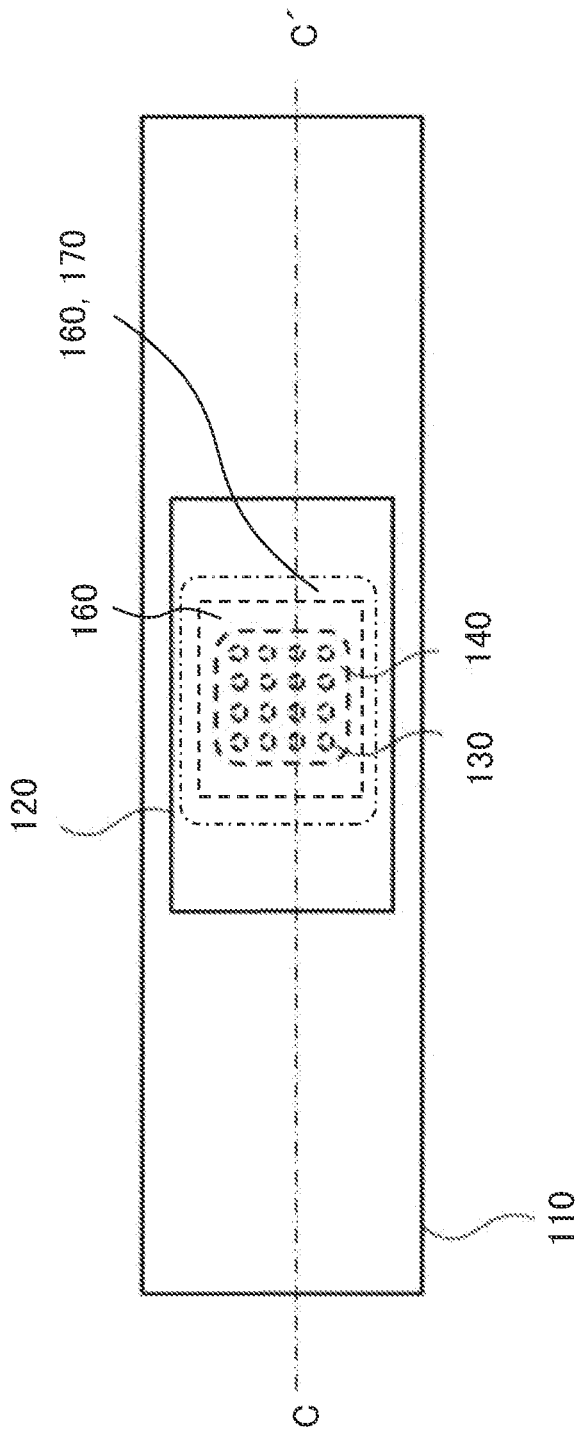
FIG. 10 is a plan view illustrating a mounting structure according to a fourth example embodiment.
Figure 11:
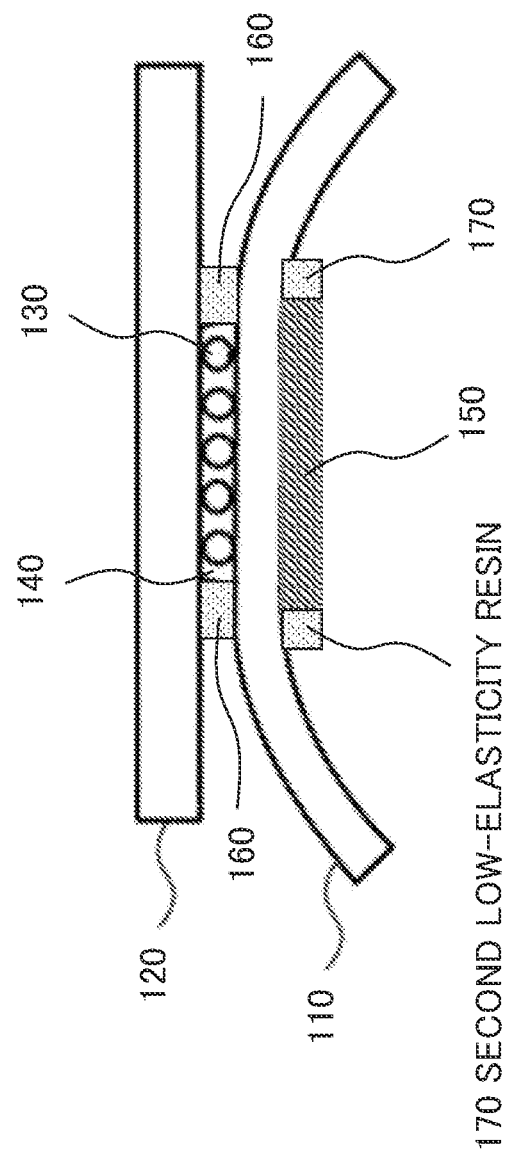
FIG. 11 is a schematic cross-sectional diagram illustrating the mounting structure according to the fourth example embodiment.

According to the present example embodiment, a configuration in which stress concentration in an end of a reinforcing material 150 is further relaxed by adding an additional element to the mounting structure 101 according to the third example embodiment is described. FIG. 10 is a plan view illustrating a mounting structure 102 for this configuration. FIG. 11 is a cross-sectional diagram in a line of C-C' of FIG. 9. Note that in FIG. 10, positions of a low-elasticity resin 160 and a second low-elasticity resin 170 are overlapped, and therefore reference signs are written side by side. As illustrated in FIG. 11, the second low-elasticity resin 170 is formed in such a way as to surround an end of the reinforcing material 150. When the second low-elasticity resin 170 is provided, stress concentration occurring in a border between an end of the reinforcing material 150 and the flexible wiring board 110 can be relaxed. Note that the low-elasticity resin 160 and the second low-elasticity resin 170 may be formed with the same material or materials different from each other.

Figure 12:
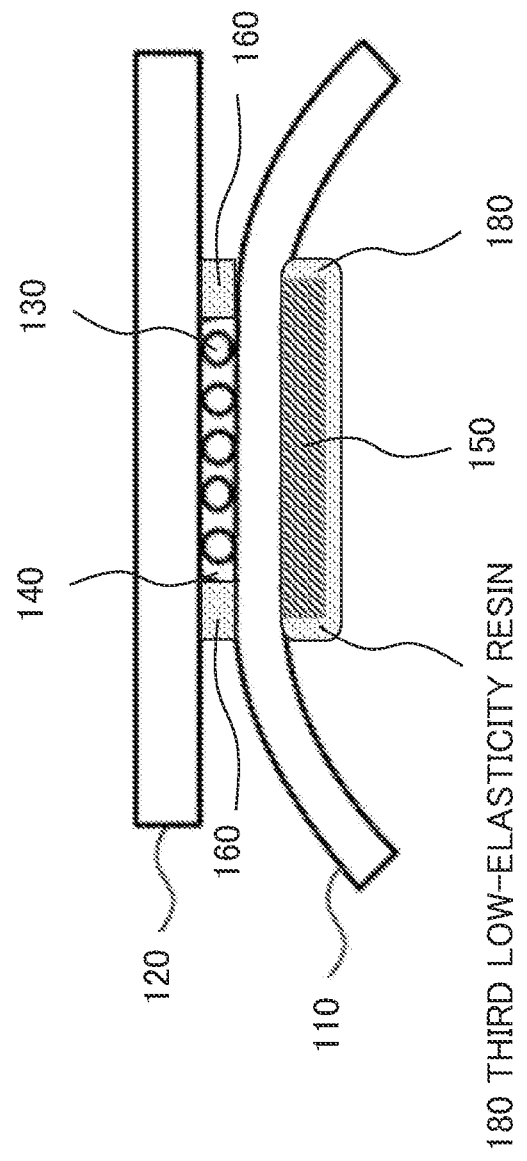
FIG. 12 is a schematic cross-sectional diagram illustrating a modified example of the mounting structure according to the fourth example embodiment.

FIG. 12 is a cross-sectional diagram illustrating a mounting structure 103 according to a modified example of the above-described mounting structure. In the mounting structure 103, a third low-elasticity resin 180 is provided in such a way as to cover both of an end and an upper face of a reinforcing material 150. When the end and the upper face are covered with a continuous third low-elasticity resin 180, adhesiveness of the third low-elasticity resin 180 to the reinforcing material 150 is increased and thereby, stress concentration can be more stably suppressed.

Fifth Example Embodiment

Figure 13:
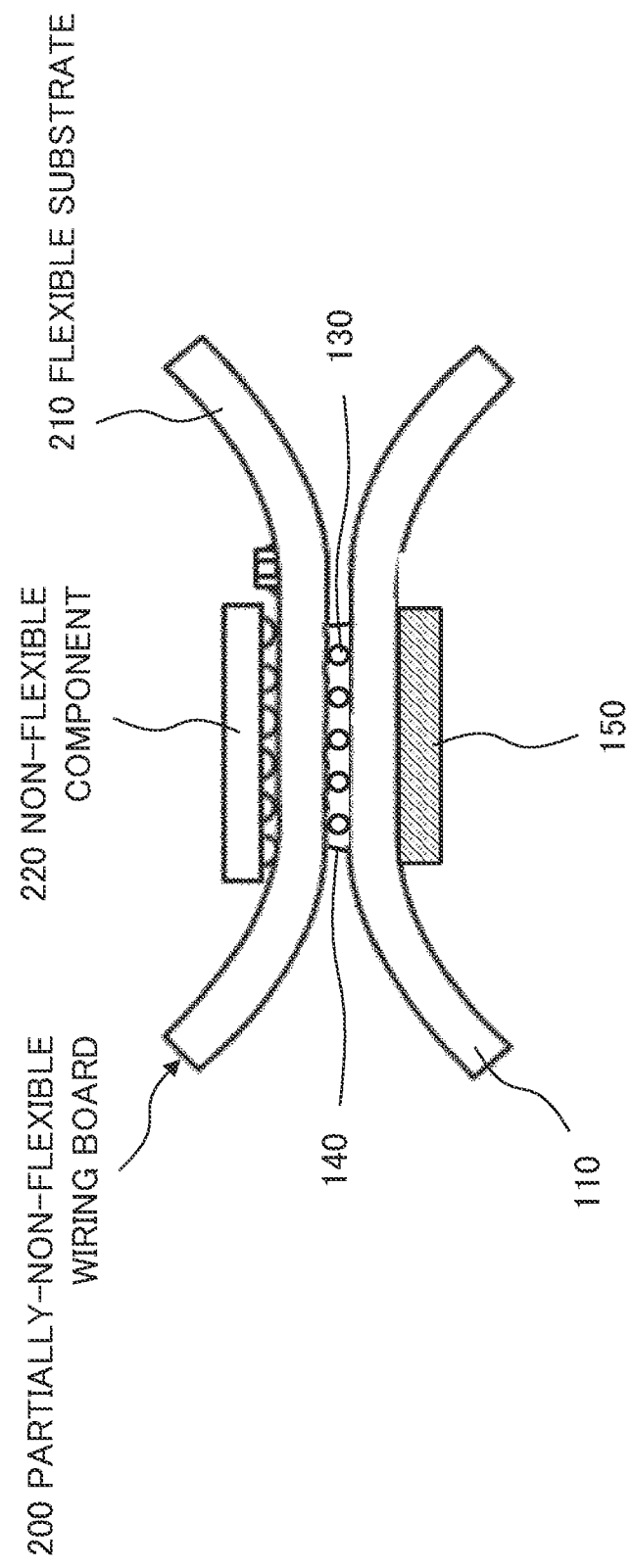
FIG. 13 is a schematic cross-sectional diagram illustrating a mounting structure according to a fifth example embodiment.

According to the first to fourth example embodiments, a non-flexible component has been described as entirely having non-flexibility, but a non-flexible component may have flexibility in a portion other than a connection unit. When a connection unit is non-flexible, the first to fourth example embodiments are applicable similarly. FIG. 13 is a schematic cross-sectional diagram illustrating an example in which a non-flexible component 220 is mounted on a flexible substrate 210 and the configuration according to the second example embodiment is applied to a partially-non-flexible wiring board 200 partially having non-flexibility. A portion connecting the non-flexible component 220 to the flexible substrate 210 can be handled similarly to the non-flexible component 120 according to the second example embodiment. Therefore, similarly to the second example embodiment, while a region where flexibility of a flexible wiring board 110 is lost is decreased, a connection unit 130 can be protected. The third and fourth example embodiments are also applicable to connection between the partially-non-flexible wiring board 200 and the flexible wiring board 110.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

The previous description of embodiments is provided to enable a person skilled in the art to make and use the present invention. Moreover, various modifications to these example embodiments will be readily apparent to those skilled in the art, and the generic principles and specific examples defined herein may be applied to other embodiments without the use of inventive faculty.

Therefore, the present invention is not intended to be limited to the example embodiments described herein but is to be accorded the widest scope as defined by the limitations of the claims and equivalents.

Further, it is noted that the inventor's intent is to retain all equivalents of the claimed invention even if the claims are amended during prosecution.

The invention claimed is:

1. A mounting structure comprising:
a flexible wiring board;
a non-flexible component;
a connection unit that is provided in a region of a bottom face of the non-flexible component, the region being narrower than the bottom face, and connects the flexible wiring board and the non-flexible component;
a protection resin that seals the connection unit in such a way that the flexible wiring board and the non-flexible component are separable from each other on an outside of the connection unit; and
a reinforcing material that is added to a face of the flexible wiring board, the face being on an opposite side to the connection unit, covers an entire region where the connection unit is provided, and covers a region on an inside of a bottom face of the non-flexible component, the region being narrower than the bottom face.

2. The mounting structure according to claim 1, wherein a low-elasticity resin having an elastic modulus lower than the protection resin is disposed in contact with an end of the protection resin.

3. The mounting structure according to claim 1, wherein a second low-elasticity resin having an elastic modulus lower than the protection resin is disposed in contact with an end of the reinforcing material.

4. The mounting structure according to claim 1, wherein the non-flexible component includes a flexible portion on an outside of the connection unit.

5. A manufacturing method of a mounting structure, the method comprising:
by using a flexible wiring board and a non-flexible component,
forming a connection unit that connects the flexible wiring board and the non-flexible component in a region of a bottom face of the non-flexible component, the region being narrower than the bottom face;
sealing the connection unit with a protection resin in such a way that the flexible wiring board and the non-flexible component are separable from each other on an outside of the connection unit; and
adding, to a face of the flexible wiring board, the face being on an opposite side to the connection unit, a reinforcing material that covers an entire region where the connection unit is provided and covers a region on an inside of the non-flexible component, the region being narrower than the bottom face.

6. The manufacturing method of a mounting structure according to claim 5, wherein
a low-elasticity resin having an elastic modulus lower than the protection resin is disposed in contact with an end of the protection resin.

7. The manufacturing method of a mounting structure according to claim 5, wherein
a second low-elasticity resin having an elastic modulus lower than the protection resin is disposed in contact with an end of the reinforcing material.

8. The manufacturing method of a mounting structure according to claim 5, wherein
the non-flexible component includes a flexible portion on an outside of the connection unit.

9. The mounting structure according to claim 2, wherein
a second low-elasticity resin having an elastic modulus lower than the protection resin is disposed in contact with an end of the reinforcing material.

10. The mounting structure according to claim 2, wherein
the non-flexible component includes a flexible portion on an outside of the connection unit.

11. The mounting structure according to claim 3, wherein
the non-flexible component includes a flexible portion on an outside of the connection unit.

12. The manufacturing method of a mounting structure according to claim 6, wherein
a second low-elasticity resin having an elastic modulus lower than the protection resin is disposed in contact with an end of the reinforcing material.

13. The manufacturing method of a mounting structure according to claim 6, wherein
the non-flexible component includes a flexible portion on an outside of the connection unit.

14. The manufacturing method of a mounting structure according to claim 7, wherein
the non-flexible component includes a flexible portion on an outside of the connection unit.

* * * * *